(12) United States Patent
Tourné

(10) Patent No.: US 7,024,086 B2
(45) Date of Patent: *Apr. 4, 2006

(54) SYSTEM AND METHOD FOR INTEGRATING OPTICAL LAYERS IN A PCB FOR INTER-BOARD COMMUNICATIONS

(75) Inventor: Joseph A. A. M. Tourné, Helmond (NL)

(73) Assignee: Viasystems Group, Inc., St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/016,146

(22) Filed: Dec. 17, 2004

(65) Prior Publication Data

US 2005/0129349 A1    Jun. 16, 2005

Related U.S. Application Data

(63) Continuation of application No. 10/179,758, filed on Jun. 25, 2002, now Pat. No. 6,834,131.

(60) Provisional application No. 60/303,380, filed on Jul. 6, 2001.

(51) Int. Cl.
   G02B 6/10     (2006.01)
   G02B 6/12     (2006.01)
   C03B 37/022   (2006.01)

(52) U.S. Cl. ................ 385/131; 385/129; 385/14; 65/386

(58) Field of Classification Search ........... 385/14, 385/88, 92, 129–132; 438/29, 31
See application file for complete search history.

(56) References Cited

U.S. PATENT DOCUMENTS

| | | | |
|---|---|---|---|
| 3,972,755 A | 8/1976 | Misfeldt | |
| 5,054,870 A | 10/1991 | Losch et al. | |
| 5,263,111 A | 11/1993 | Nurse et al. | |
| 5,680,698 A | 10/1997 | Armington et al. | |
| 5,808,272 A | 9/1998 | Sun et al. | |
| 5,891,795 A | 4/1999 | Arledge et al. | |
| 6,185,354 B1 | 2/2001 | Kronz et al. | |
| 6,370,292 B1 | 4/2002 | Strake | |
| 6,611,635 B1 | 8/2003 | Yoshimura et al. | |
| 6,705,124 B1 * | 3/2004 | Zhong et al. | 65/386 |
| 6,760,497 B1 | 7/2004 | Straub | |
| 6,834,131 B1 * | 12/2004 | Tourne | 385/14 |

* cited by examiner

Primary Examiner—Kaveh Kianni
Assistant Examiner—Erin Chiem
(74) Attorney, Agent, or Firm—Dunlap, Codding & Rogers, P.C.

(57) ABSTRACT

Polymers of differing refraction indices are embedded within a PCB to provide optical connectivity of the PCB with other circuit boards via an optic backplane. The creation of islands of polymer material of refractive index $n1$ completely surrounded by polymer material with refractive index $n2$ where $n1$ has a higher index than $n2$ allows the islands of $n1$ indexed polymer to serve as optical waveguides. A process of forming a multi-layered PCB with the optical waveguide islands using successive laminations and using laser ablation to write the optical connection scheme is taught. Further, the use of uniquely marked targets in a copper layer to align the optical waveguides in production is also taught. Additionally, the use of clearing polymer materials and reinforcing polymer voids with lamination to allow a simple, high tolerance insertion of through-holes is taught.

19 Claims, 8 Drawing Sheets

SYSTEM AND METHOD FOR INTEGRATING OPTICAL LAYERS IN A PCB FOR INTER-BOARD COMMUNICATIONS

CROSS REFERENCE TO RELATED APPLICATIONS

The present application is a continuation of U.S. Ser. No. 10/179,758, filed Jun. 25, 2002, now U.S. Pat. No. 6,834,131, which claims priority under 35 U.S.C. § 119(e) from provisional application no. 60/303,380 filed Jul. 6, 2001; the entire contents of which are hereby expressly incorporated herein by reference.

BACKGROUND OF THE INVENTION

1. Field of the Invention

The present invention relates generally to the field of printed circuit boards. More particularly, the present invention relates to multi-level printed circuit boards (or "PCBs") that integrate optical data communications with other boards without electrical connections. That is, the present invention relates to backplane circuit boards that integrate photonic connection.

2. Background Information

Today, much of the world's communication is carried on optical fibers, the data encoded in modulated light. Transmission rates are measured in billions of bits per second, until the data reaches its destination. There, the light is converted into electrical impulses so that it may be routed electronically. The result is lower data rates and increased delay.

Opto-electronic devices are being developed that incorporate waveguide structures on silicon substrates allowing for integration of light buses and electrical buses. These integrated devices will replace discrete components and make the transition from photon streams to electron streams more efficient and/or eliminate the transition altogether. Clearly, the ultimate efficiency will be achieved when no conversion from light to electrical signals is required, thus enabling communication as light from source to destination.

One of the impediments to achieving this objective is the backplane. The backplane is the interconnecting point for devices in a system and may be passive or intelligent. Typically, devices (sometimes referred to as "daughter boards") are plug into a backplane through mechanical means. Additional cabling may be required to interconnect devices to each other or other points on the backplane resulting in slower data transfer rates, increased opportunities for failure, and increased costs. Opto-electronic devices require an electrical and/or an optical interface to the backplane.

Typically, backplanes and daughter boards are constructed on printed circuit boards (PCBs) on to which discrete components are mounted. What is needed are daughter-boards and backplanes constructed from PCBs that have both electrical and optical interfaces so as to eliminate additional cabling and to reduce or eliminate the need to convert from light signals to electrical signals. Such PCBs would also incorporate passive components such as multi-plexers, de-multiplexers, transducers and interferometers to effect optical signaling.

SUMMARY OF THE INVENTION

An object of the present invention is to integrate an optical transmitting material with a PCB to allow optical signals to be transmitted between circuit boards.

Another object of the present invention is to integrate optical polymers with PCB production to allow optical signal transmission.

Still another object of the present invention is to integrate a circuit board with an optical backplane to communicate using optical transmission to facilitate handling, insertion and removal of daughter boards without the need for connection cabling.

Yet another object of the present invention is to define optical transmitting polymers (optical waveguides) in a PCB by writing the connection scheme with a laser.

A further object of the present invention is to develop a method for producing PCBs integrated with optical waveguides using laser technology.

Yet a further object of the present invention is to develop a method for integrating optical waveguides with a PCB using successive laminations of optical conductive materials of differing refractive indices.

Still another object of the present invention is to use target marks on a copper layer to align optical waveguide positioning.

A PCB is designed to generate optical signals that allow an optical backplane to communicate with an inserted circuit board without use of electrical cabling. A surface or connector on the PCB is designed to allow transmission of light energy (signals). A preferred implementation is to use a polymer such as Polyguide™. The polymer used needs to have good optical properties and high temperature resistance.

The PCB is laminated with a surface coat of a material having a specific refraction index, n2. In one embodiment of the present invention, the exterior laminate is a polymer material such as Polyguide™. The polymer layer is laminated over a copper layer. The copper layer is roughed prior to lamination by chemical or mechanical or combination process to improve adhesion. The entire PCB surface is then covered with the polymer.

A second polymer layer is then layered on top of the first polymer layer. This layer has a different refraction index, n1. The optical signal is transmitted in the second polymer layer.

The layers are then channeled by an automated method such as laser ablation. The channeling process leaves a void in the polymer layers. The copper layer is exposed where the dual polymer layers are channeled. Alignment of the laser ablation is to a recognizable pattern as a mark on the surface copper layer. The mark which is etched on the copper is a shape designed for easy recognition by the automated laser tools.

Those channels or voids are then filled in with the polymer having refraction index n2. The second polymer with the higher refraction index, n1, is sandwiched by the first polymer. The sandwiched polymer layer serves as an optical waveguide. The waveguide also incorporates other passive components such as multiplexers, de-multiplexers, transducers and interferometers to effect optical signaling.

Those locations where through-holes are to be drilled are channeled by a laser ablation process prior to the through hole drilling. The multi-layer PCB is finished by a final lamination of "prepeg" and a copper foil deposit on both top and bottom. Then the through holes are drilled finishing the optical signal transmission.

DETAILED DESCRIPTION

Figure 1:
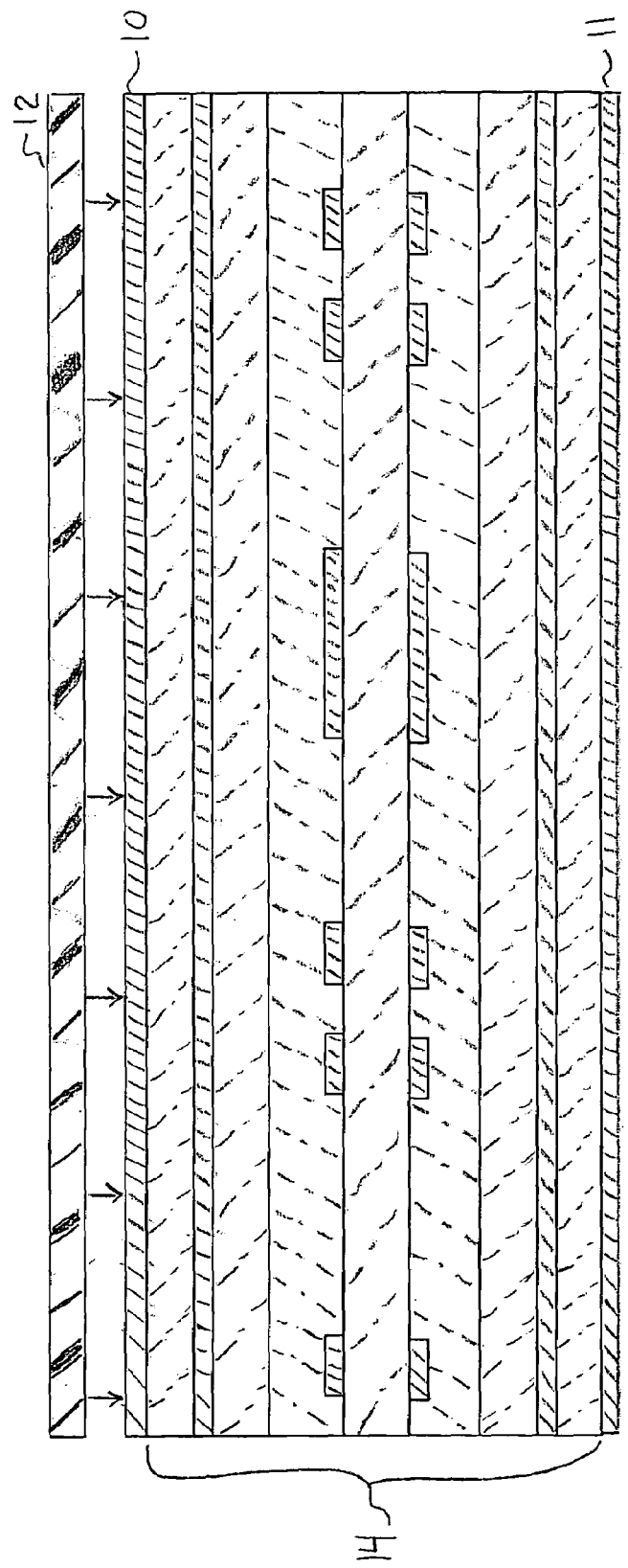
FIG. 1 illustrates a sectional view of a partially finished multi-layered PCB with an outer copper layer being covered with a polymer layer.

Referring to FIG. 1, a sectional view is illustrated of a multi-layered PCB with the outer most layers of copper, at an initial stage of optical integration. A multi-layered PCB 14 is covered top and bottom with copper layers 10, 11. In this way, the PCB is first built for supporting electrical circuitry and functions, and then incorporates an optical conductive layer into its structure. The core of the multi-layer PCB is processed before laminating a first optical conductive layer 12. According to one embodiment of the present invention the optical conductive layer 12 is a polymer material sold under the tradename Polyguide™. The first polymer laminate layer 12 has a specific refraction index n2. The laminate covers the entire top surface area of the PCB, over the top copper layer 10.

According to one embodiment of the present invention, the top copper layer 10 is roughened prior to laminating the surface with the polymer coat 12 in order to improve adhesion. For example, a chemical, mechanical or combination chemical and mechanical abrasion process may be used. Other abrasion processes as known may be employed.

The optical polymer material is best suited for practice of the present invention if it has the following characteristics: good optical properties (i.e. low dispersion); high temperature and abrasion resistance to avoid damage to the material during fabrication and assembly; and a Z-axis coefficient of expansion comparable to the glass reinforced material used in the PCB. A typical epoxy based system has a thermal expansion coefficient (CTE) in the range of 100–150 ppm in the Z-axis. CTE in the X-axis and Y-axis is in the range of 16–18 ppm.

Figure 2:
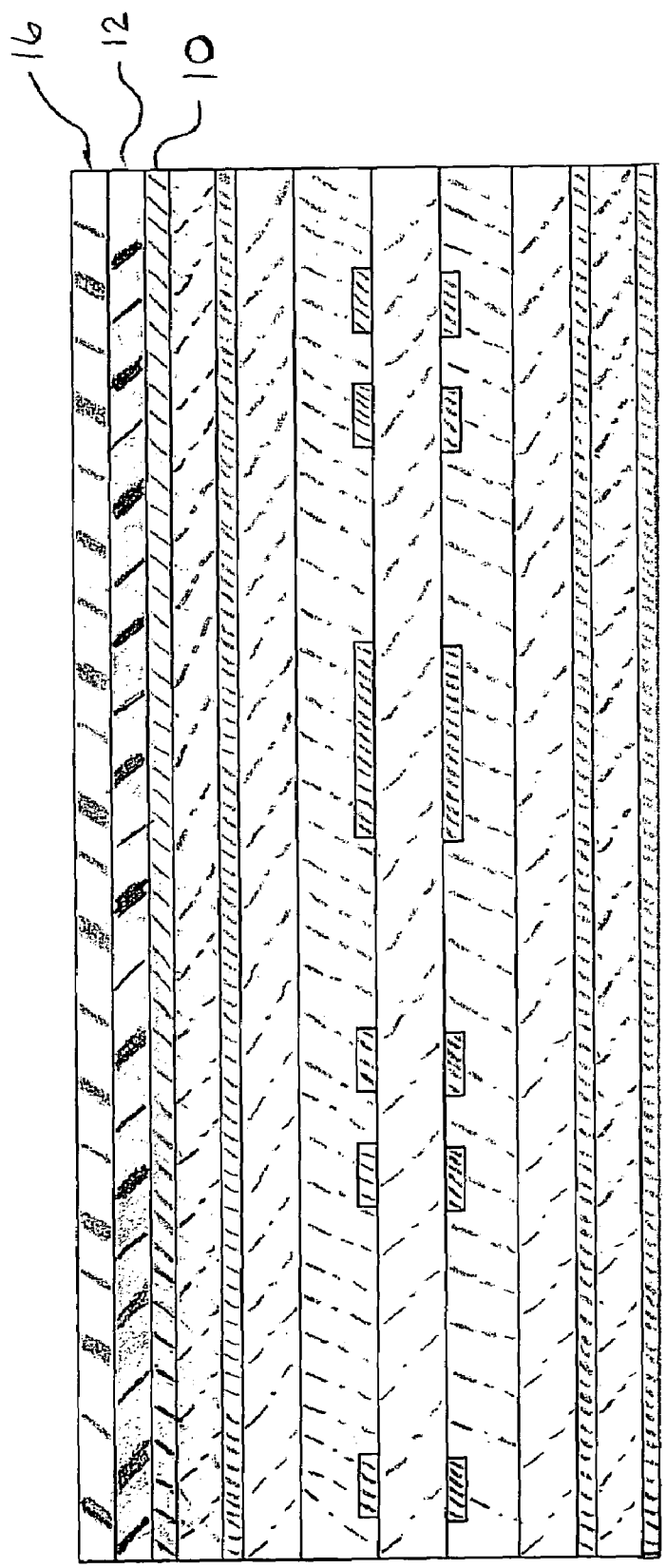
FIG. 2 illustrates a sectional view of a partially finished multi-layered PCB with a second polymer layer on top of the first polymer layer.

Referring to FIG. 2, a sectional view of a partially finished multi-layered PCB is illustrated at a subsequent stage of processing, with a second polymer layer on top of the first polymer layer. A second polymer layer 16 is laminated on top of the first polymer layer 12. The second polymer layer 16 covers the entire top surface area. The second polymer layer 16 requires the same properties as the first polymer layer 12.

The second polymer laminate has a specific refraction index n1. Refraction index n1 is greater than refraction index n2. The optical signal is transmitted in the n1 index layer.

Figure 3:
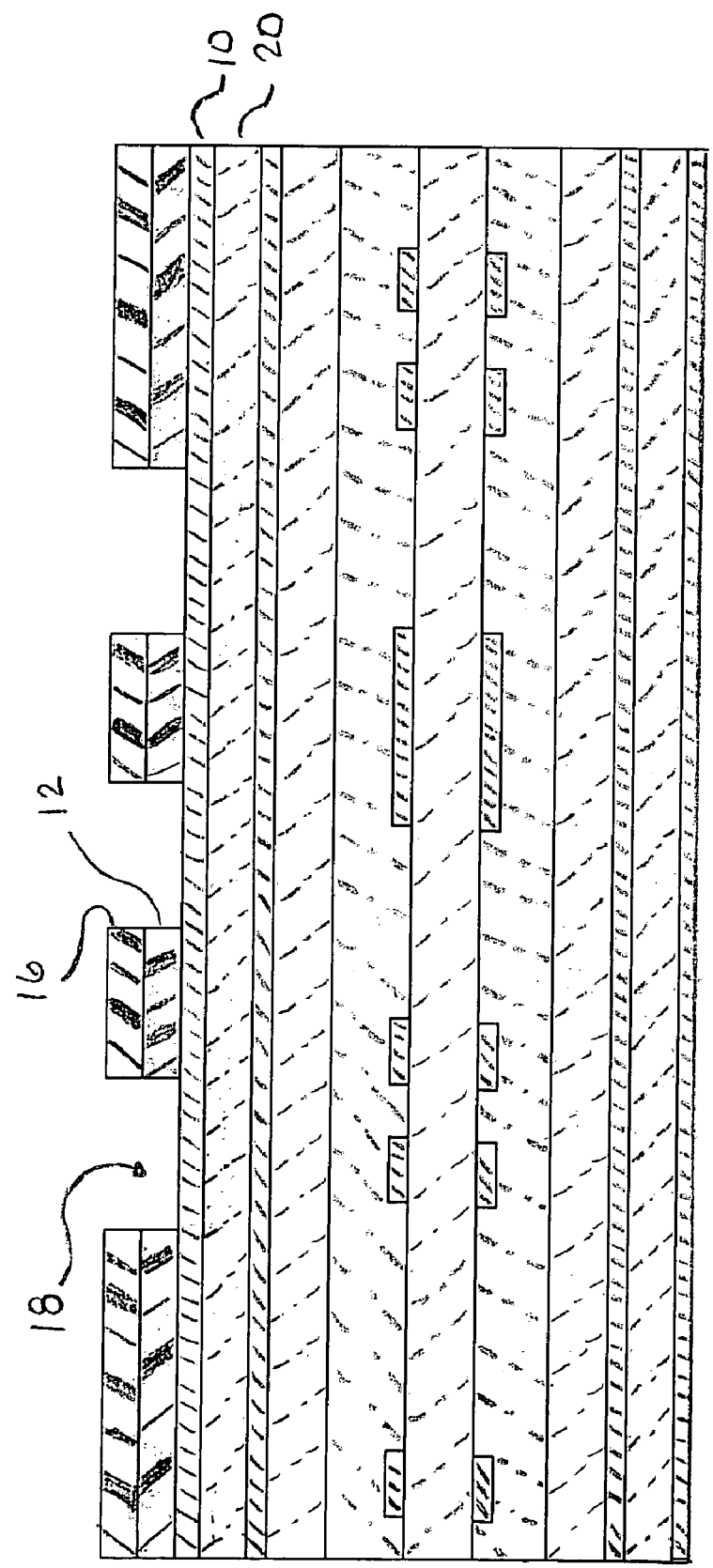
FIG. 3 illustrates a sectional view of the first and second polymer layers channeled by laser ablation.

Referring to FIG. 3, a sectional view is illustrated of the first and second polymer layers channeled by laser ablation. The two optical conductive polymer layers 12, 16 are channeled creating a void 18 in the first and second polymer layers. According to one embodiment of the present invention laser ablation is used. The laser has an automatic depth control. The laser has insufficient energy to cut the copper layer 10. The copper integrity is maintained so that the dielectric layer 20 just below the copper layer is not penetrated. Other methods and processes that create cavities or voids in the two polymer layers down to the copper layer 10 will not affect the implementation of the present invention.

Figure 3A:
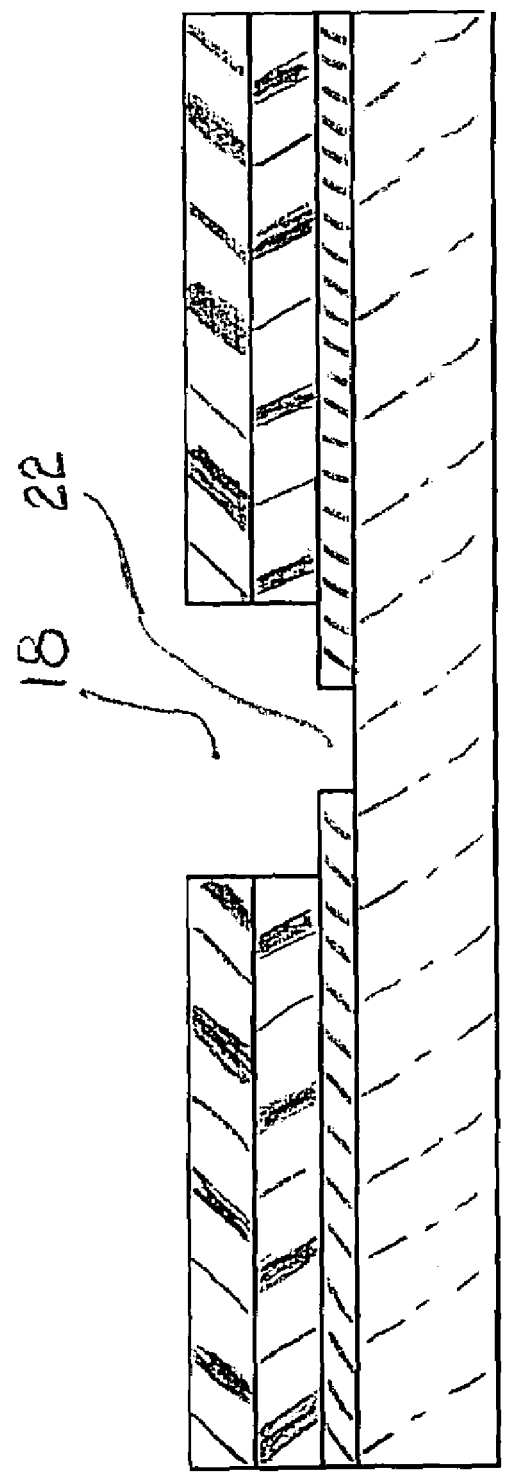
FIG. 3a illustrates a sectional view of the surface copper layer marked with a unique, easily recognizable pattern.

Referring to FIG. 3a, a sectional view is illustrated of the surface copper layer marked with a unique, easily recognizable pattern. The copper is marked in some of the locations where the polymer layers have been voided 18. One implementation of the present invention etches or marks the copper layer to create a target 22 for alignment of laser ablation processes. The targets 22 are positioned so as not to interfere with the circuitry and PCB design logic. An embodiment of the present invention places these "alignment" targets or features on the edges of PCB. Multiple marks are used; the more marks the greater the accuracy. The targets 22 are uniquely shaped so as to facilitate automatic recognition. According to one aspect of the present invention, the copper is etched with chemicals. Alternatively, the present invention uses a laser to mark the alignment feature in the copper layer. As further alternative, the present invention uses a mechanical process to mark the copper targets.

Figure 4:
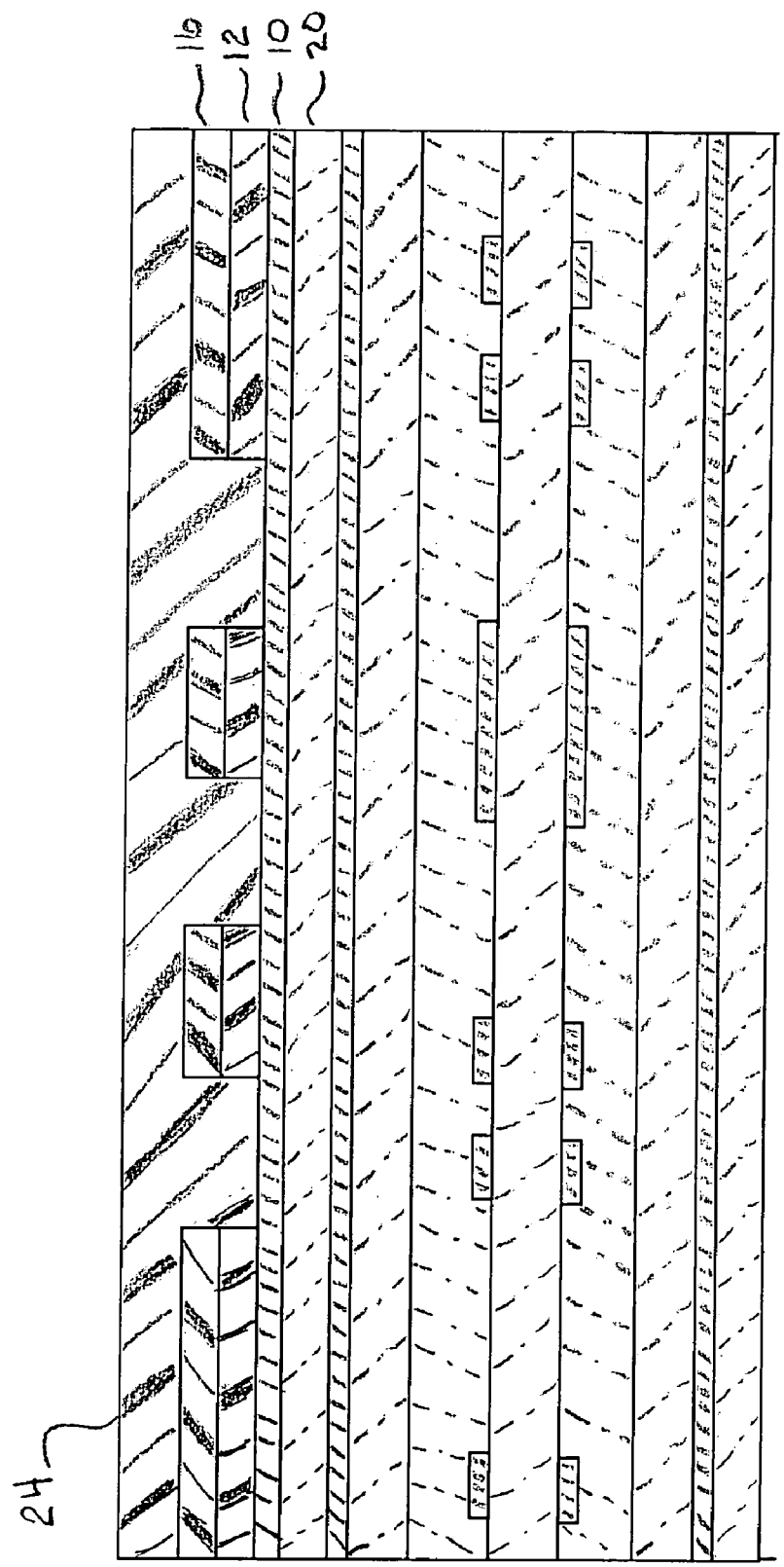
FIG. 4 illustrates a sectional view of the multi-layered PCB after an additional coat of the first polymer material has been layered, over the top polymer layer, filling in the laser created channels.

Referring to FIG. 4, a sectional view is illustrated of a multi-layered PCB after an additional coat of the first polymer material has been layered over the top polymer layer, filling in the laser created channels. A third polymer layer 24 is laminated over the top surface of the PCB, covering the PCB to a uniform thickness. The voids created by laser ablation are filled. The third polymer layer is of the same refraction index, n2, as the first polymer layer 12. When the polymer layer voids are filled in, islands of the second polymer layer 16 with refraction index n1 result. These islands are referred to as "optical waveguides". The optical waveguides are surrounded by polymer material with lesser refraction index n2.

These optical waveguide islands 16 transmit optical signals and allow inter-circuit board connectivity via an optical backplane without the need for electrical cabling. The laser ablation process defines the optical waveguides, writing the connection scheme for the PCB and backplane. Other passive components such as multiplexers, de-multiplexers, transducers and interferometers are also integrated in the circuitry to effect optical signaling. The optical waveguides transmit the optical signals allowing inter-board communications.

Figure 5:
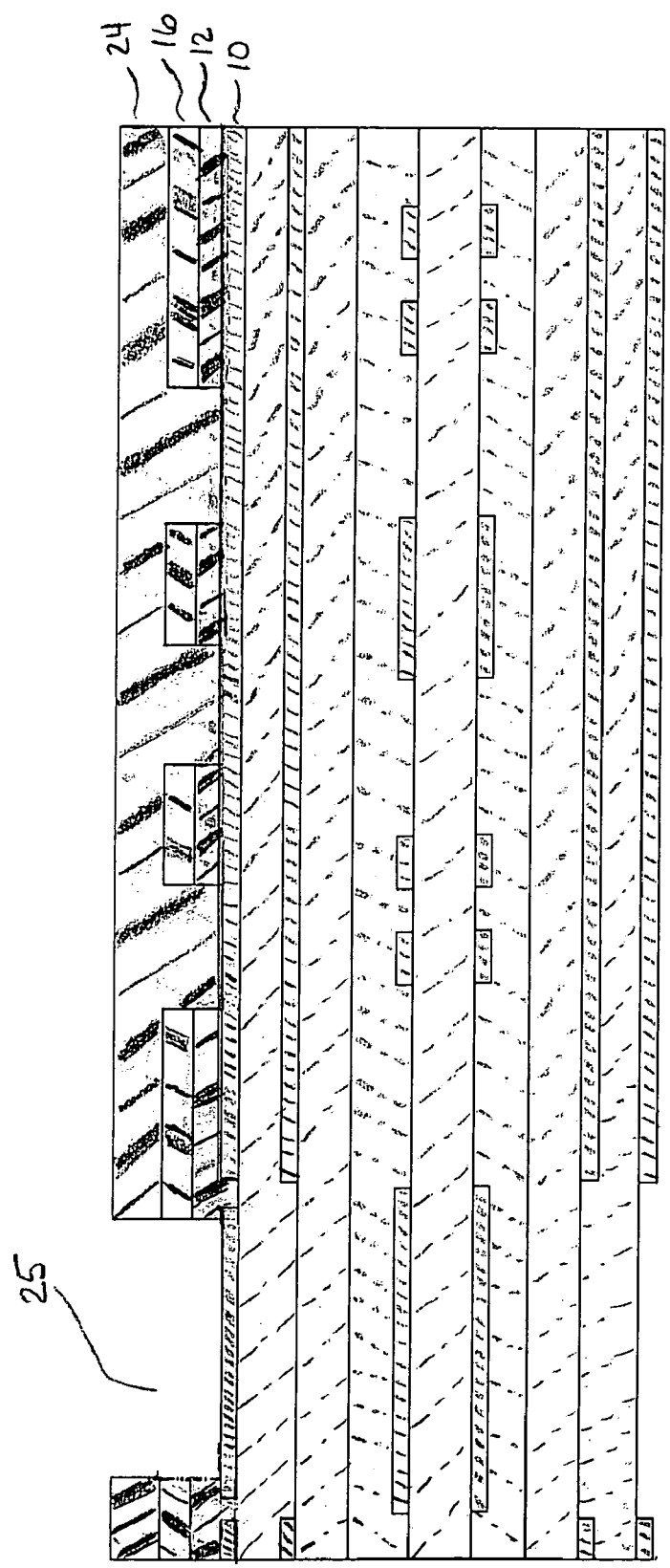
FIG. 5 illustrates a sectional view of the multi-layered PCB further channeled in the location where through-hole will be drilled.

Referring to FIG. 5, a sectional view is illustrated of the multi-layered PCB further channeled in the location where a through-hole will be drilled. Where a through-hole is to be located, a void 25 is created in the multiple layers of polymer above the top copper layer 10. As described supra, laser ablation process is employed to remove the polymer material 12, 16, 24 to the copper layer 10. It is noted that other processes, not herein described, that remove (i.e. channel) polymer layers in the multi-layered PCB will allow the present invention to be practiced.

Figure 6:
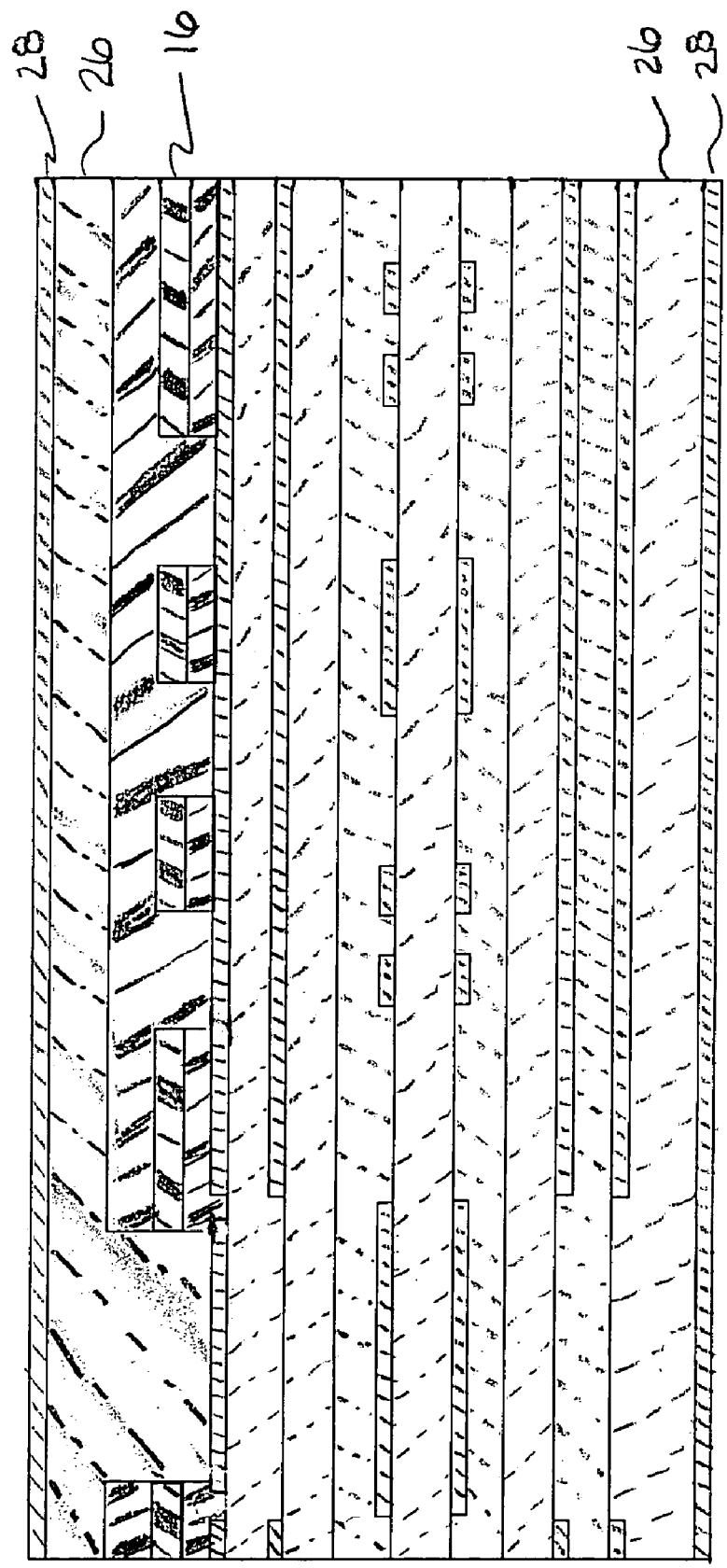
FIG. 6 illustrates a sectional view of the multi-layered PCB after "prepeg" and copper foil has been pressed in place prior to the insertion of through-holes.

Referring to FIG. 6, a sectional view is illustrated of the multi-layered PCB after "prepeg" and copper foil has been pressed in place prior to the insertion of through-holes. In one embodiment of the present invention, prepeg 26 (a non-conductive material) is pressed (laminated) on the top and bottom surfaces of the PCB. A layer of copper foil 28 is then pressed on each side to finish the layered PCB in anticipation of inserting through-holes.

Figure 7:
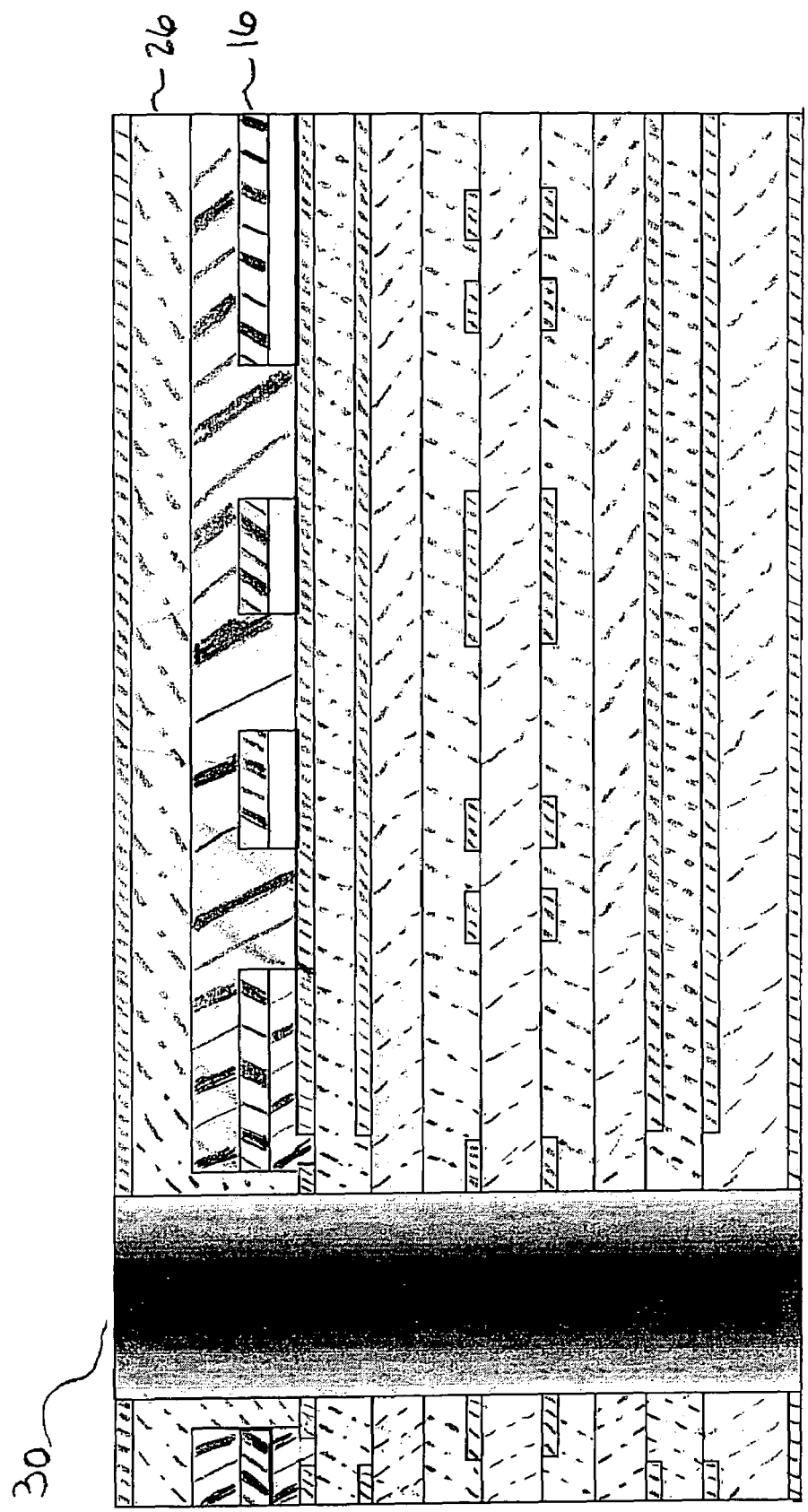
FIG. 7 illustrates a sectional view of the multi-layered PCB after drilling of a through-hole.

Referring to FIG. 7, a sectional view of the multi-layered PCB after drilling of a through-hole is illustrated. A through-hole 30 is then inserted. One embodiment of the present invention inserts the through-hole by a mechanical drilling of the multi-layered PCB. The through-hole 30 is used for mounting components or used as a via hole to access internal layers of the PCB. The removal of polymer material does not compromise the through-hole integrity. The prepeg material 26 maintains the sidewalls of the through-hole. Note that the optical waveguides 16 are preserved.

The present invention, "System and Method for Integrating Optical Layers in a PCB for Inter-Board Communications" has been described in terms of preferred embodiments. It will be appreciated that various modifications and improvements may be made to the described embodiments without departing the scope of the invention.

What is claimed is:

1. A method for integrating an optical transmitting material with a printed circuit board having an outer surface, the method comprising:
    applying a layer of a first material onto the outer surface of the printed circuit board;
    applying a layer of a second material onto the layer of first material, wherein the second material has a refraction index greater than a refraction index of the first material;
    creating a channel through the layer of second material; and
    applying a layer of a third material onto the second material, wherein the third material has a refraction index less than the refraction index of the second material and wherein the layer of third material fills the channel and covers the remaining layer of second material such that the remaining layer of second material forms at least one optical waveguide.

2. The method of claim 1, wherein the first material and the third material have substantially the same refraction index.

3. The method of claim 1, wherein the coefficient of thermal expansion of the first, second, and third materials are substantially the same as the coefficient of thermal expansion of the printed circuit board.

4. The method of claim 1, wherein the first, second, and third materials are polymers.

5. The method of claim 4, wherein the first material and the third material are the same polymer.

6. The method of claim 1, wherein the outer surface of the printed circuit board is roughened prior to applying the layer of first material onto the outer surface of the printed circuit board.

7. The method of claim 6, wherein the outer surface of the printed circuit board is roughened by at least one of a mechanical means or a chemical means.

8. The method of claim 1, wherein the printed circuit board has a plurality of marks on the outer surface of the printed circuit board, wherein the marks define the path of the channel.

9. The method of claim 8, wherein the step of creating the channel through the layer of second material comprises ablating the second material with a laser generally along the marks defining the path of the channel.

10. The method of claim 8, wherein the step of ablating the second material with the laser comprises:
    aligning the laser using the plurality of marks; and
    ablating the layer of second material along the path defined by the plurality of marks.

11. The method of claim 1, wherein the printed circuit board comprises an insulating material and the outer surface of the printed circuit board comprises a layer of copper foil applied to the insulating material.

12. The method of claim 1, further comprising the steps of:
    applying onto the layer of third material a layer of nonconductive material; and
    applying onto the nonconductive material a layer of conductive material.

13. The method of claim 12, wherein the nonconductive material is prepreg.

14. The method of claim 12, wherein the conductive material is copper foil.

15. A method for integrating an optical transmitting material with a printed circuit board having an outer surface, the method comprising:
    applying a layer of a first material onto the outer surface of the printed circuit board;
    applying a layer of a second material onto the layer of first material, wherein the second material has a refraction index greater than a refraction index of the first material;
    creating a channel through the layer of second material;
    applying a layer of a third material onto the second material, wherein the third material has a refraction index less than the refraction index of the second material and wherein the layer of third material fills the channel and covers the remaining layer of second material such that the remaining layer of second material forms at least one optical waveguide;
    identifying a location for a through-hole in the printed circuit board;
    creating a void in the layers of first, second, and third materials at the location for the through-hole;
    applying a layer of nonconductive material so as to substantially fill the void; and
    creating an opening, at the location for the through-hole, through the layer of nonconductive material and the printed circuit board thereby creating the through-hole in the printed circuit board.

16. The method of claim 15, wherein the through-hole is used for at least one of a mounting means or a via hole.

17. The method of claim 15, wherein the nonconductive material is prepreg.

18. A method of forming an optical waveguide on a substrate, comprising the steps of:
    applying a layer of a first material onto the substrate;
    applying a layer of a second material onto the layer of first material, wherein the second material has a refraction index greater than a refraction index of the first material;
    creating a channel through the layer of second material; and
    applying a layer of a third material onto the layer of second material, wherein the third material has a refraction index less than the refraction index of the second material and wherein the layer of third material fills the channel and covers the remaining layer of second material such that the remaining layer of second material forms at least one optical waveguide.

19. The method of claim 18, wherein the substrate is a printed circuit board.

* * * * *